US 6,654,286 B2

(12) United States Patent
Kawakami

(10) Patent No.: US 6,654,286 B2
(45) Date of Patent: Nov. 25, 2003

(54) NONVOLATILE SEMICONDUCTOR MEMORY DEVICE DETECTING SIGN OF DATA TRANSFORMATION

(75) Inventor: Yukitoshi Kawakami, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/061,191

(22) Filed: Feb. 4, 2002

(65) Prior Publication Data

US 2002/0105832 A1 Aug. 8, 2002

(30) Foreign Application Priority Data

Feb. 5, 2001 (JP) ........................................ 2001-028712

(51) Int. Cl.⁷ .............................................. G11C 11/34
(52) U.S. Cl. ............................ 365/185.21; 365/189.01
(58) Field of Search ......................... 365/185.21, 189.01

(56) References Cited

U.S. PATENT DOCUMENTS 6,081,453 A * 6/2000 Iwahashi ................ 365/185.22
6,118,704 A * 9/2000 Hirata .................... 365/185.24

FOREIGN PATENT DOCUMENTS

JP        A-8-249893        9/1996

OTHER PUBLICATIONS

Betty Prince, "Semiconductor Memories", 1983, Wiley 2$^{nd}$ edition, pp. 162–163.*

* cited by examiner

*Primary Examiner*—M. Tran
(74) *Attorney, Agent, or Firm*—Arent Fox Kintner Plotkin & Kahn, PLLC

(57) ABSTRACT

A nonvolatile semiconductor memory device includes a memory cell array, a reference potential generating circuit which generates a first reference potential, a second reference potential higher than the first reference potential, and a third reference potential lower than the first reference potential, a sense amplifier which makes a first determination by comparing a potential of data retrieved from the memory cell array with the first reference potential, and makes a second determination by comparing the potential of the data with one of the second reference potential and the third reference potential, and a comparison unit which compares the first determination with the second determination.

10 Claims, 7 Drawing Sheets

NONVOLATILE SEMICONDUCTOR MEMORY DEVICE DETECTING SIGN OF DATA TRANSFORMATION

BACKGROUND OF THE INVENTION

1. Field of the Invention

The present invention generally relates to semiconductor memory devices, and particularly relates to a nonvolatile semiconductor memory device that permits data write and data erase.

2. Description of the Related Art

In nonvolatile semiconductor memory devices for which data write and data erase are electrically performed, each read or write operation disturbs memory cells connected to the same word line that is connected to an accessed memory cell. During a read operation, for example, a word line is activated to a predetermined potential. The potential of the activated word line for read operation is lower than a high potential applied to word lines during a program operation, but affects memory cells in the same manner as during the program operation, thereby possibly injecting electric charge into floating gates. Further, repeated write operations and erase operations degrade the oxide layers of nonvolatile semiconductor memory devices.

Because of these factors as described above, nonvolatile semiconductor memory devices suffer charge loss or charge gain, resulting in the transformation of stored data. Charge loss refers to the leakage of electric charge from the floating gates, and charge gain refers the accumulation of electric charge in the floating gates. Such data transformation occurring in the conventional nonvolatile semiconductor memory devices will be detected only after the transformed data is read from memory cells.

Accordingly, there is a need for a nonvolatile semiconductor memory device which can prevent data transformation even when charge loss or charge gain occurs in floating gates.

SUMMARY OF THE INVENTION

It is a general object of the present invention to provide a nonvolatile semiconductor memory device that substantially obviates one or more of the problems caused by the limitations and disadvantages of the related art.

Features and advantages of the present invention will be set forth in the description which follows, and in part will become apparent from the description and the accompanying drawings, or may be learned by practice of the invention according to the teachings provided in the description. Objects as well as other features and advantages of the present invention will be realized and attained by a nonvolatile semiconductor memory device particularly pointed out in the specification in such full, clear, concise, and exact terms as to enable a person having ordinary skill in the art to practice the invention.

To achieve these and other advantages and in accordance with the purpose of the invention, as embodied and broadly described herein, a nonvolatile semiconductor memory device according to the present invention includes a memory cell array, a reference potential generating circuit which generates a first reference potential, a second reference potential higher than the first reference potential, and a third reference potential lower than the first reference potential, a sense amplifier which makes a first determination by comparing a potential of data retrieved from the memory cell array with the first reference potential, and makes a second determination by comparing the potential of the data with one of the second reference potential and the third reference potential, and a comparison unit which compares the first determination with the second determination.

The nonvolatile semiconductor memory device as described above makes a first data determination by performing a normal and routine read operation using the read-operation reference potential, and then makes a second data determination by using the program-verify-purpose reference potential or the erase-verify-purpose reference potential that poses stricter conditions than the read-operation reference potential. If the first data determination and the second data determination are the same, a check result indicative of "pass" is output to an exterior of the device or the like, indicating that there is no apparent sign of data transformation. If the first data determination and the second data determination are different, a check result indicative of "fail" is output to an exterior of the device or the like, indicating that there is a sign of ongoing data transformation. A controller provided outside the device, for example, detects the check result indicative of the presence or absence of data transformation, and carries out a data rewrite operation or a data overwrite operation with respect to the nonvolatile semiconductor memory device as necessary. Alternatively, operations of an internal control circuit may be configured such that a data rewrite operation or a data overwrite operation is internally performed.

In the nonvolatile semiconductor memory device as described above, operations by the sense amplifier of making the first determination and the second determination and an operation by the comparison unit of comparing the first determination with the second determination may be performed in response to instruction from an exterior of the nonvolatile semiconductor memory device.

According to another aspect of the present invention, the nonvolatile semiconductor memory device as described above further includes a plurality of word lines selectively activated, a plurality counters, each of which is provided for a corresponding one of the word lines, and counts a number as to how many times the corresponding one of the word lines is activated, and a check circuit which checks whether any one of the counters indicates the counted number that exceeds a predetermined number. Then, operations by the sense amplifier of making the first determination and the second determination and an operation by the comparison unit of comparing the first determination with the second determination are performed in response to a finding by the check circuit that one of the counters indicates the counted number that exceeds the predetermined number. With this provision, the nonvolatile semiconductor memory device on its own can check a sign of the presence/absence of ongoing data transformation at appropriate timing, thereby eliminating a need for an external controller or the like to manage the check timing.

Other objects and further features of the present invention will be apparent from the following detailed description when read in conjunction with the accompanying drawings.

DESCRIPTION OF THE PREFERRED EMBODIMENTS

In the following, embodiments of the present invention will be described with reference to the accompanying drawings.

Figure 1:
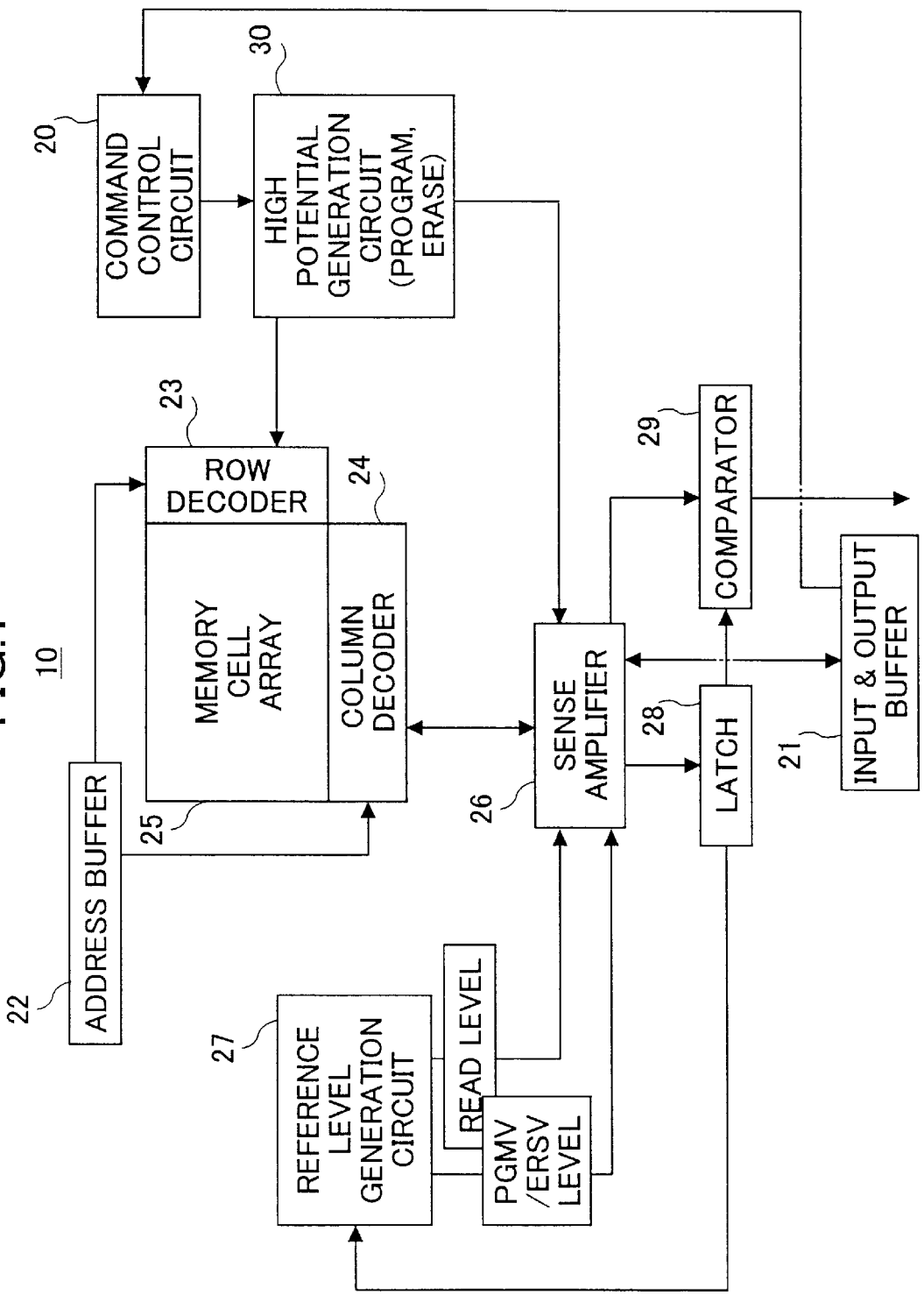
FIG. 1 is a block diagram of a nonvolatile semiconductor memory device according to the present invention.

FIG. 1 is a block diagram of a nonvolatile semiconductor memory device according to the present invention.

The nonvolatile semiconductor memory device 10 of FIG. 1 includes a command control circuit 20, an input-&-output buffer 21, an address buffer 22, a row decoder 23, a column decoder 24, a memory cell array 25, a sense amplifier 26, a reference level generation circuit 27, a latch 28, a comparator 29, and a high potential generation circuit 30.

The address buffer 22 receives address signals from an exterior of the device, and supplies the address signals to the row decoder 23 and the column decoder 24. The row decoder 23 decodes the address supplied from the address buffer 22, and activates a word line of the memory cell array 25 according to the decoded results. The column decoder 24 decodes the address supplied from the address buffer 22, and couples bit lines of the memory cell array 25 selectively to the sense amplifier 26. This establishes data-read/write path with respect to the memory cell array 25.

The memory cell array 25 includes a memory cell array, word lines, bits lines, etc., and stores data in each memory cell. At the time of data read operation, data of memory cells specified by an activated word line are supplied to the column decoder 24. In the case of program or erase operation, the high potential generation circuit 30 operating under the control of the command control circuit 20 generates potentials, thereby setting the word lines and bit lines of the memory cell array 25 to potentials proper to a selected operation. This carries out the injection of charge into or the removal of charge from the memory cells.

The sense amplifier 26 compares the level of data supplied through the column decoder 24 from the memory cell array 25 with a read reference level Read Level supplied from the reference level generation circuit 27, thereby checking whether the data is "0" or "1". The check result is supplied from the input-&-output buffer 21 to an exterior of the device as read data. A verify operation associated with a program operation or an erase operation is performed by comparing the level of data supplied through the column decoder 24 from the memory cell array 25 with a reference level PGMV Level or ERSV Level supplied from the reference level generation circuit 27.

The reference level generation circuit 27 includes reference cell transistors for the reference purpose. Operating under the control of the command control circuit 20, the reference level generation circuit 27 uses reference memory cells to generate reference levels used for data checks, and supplies the generated reference levels to the sense amplifier 26.

Figure 2:
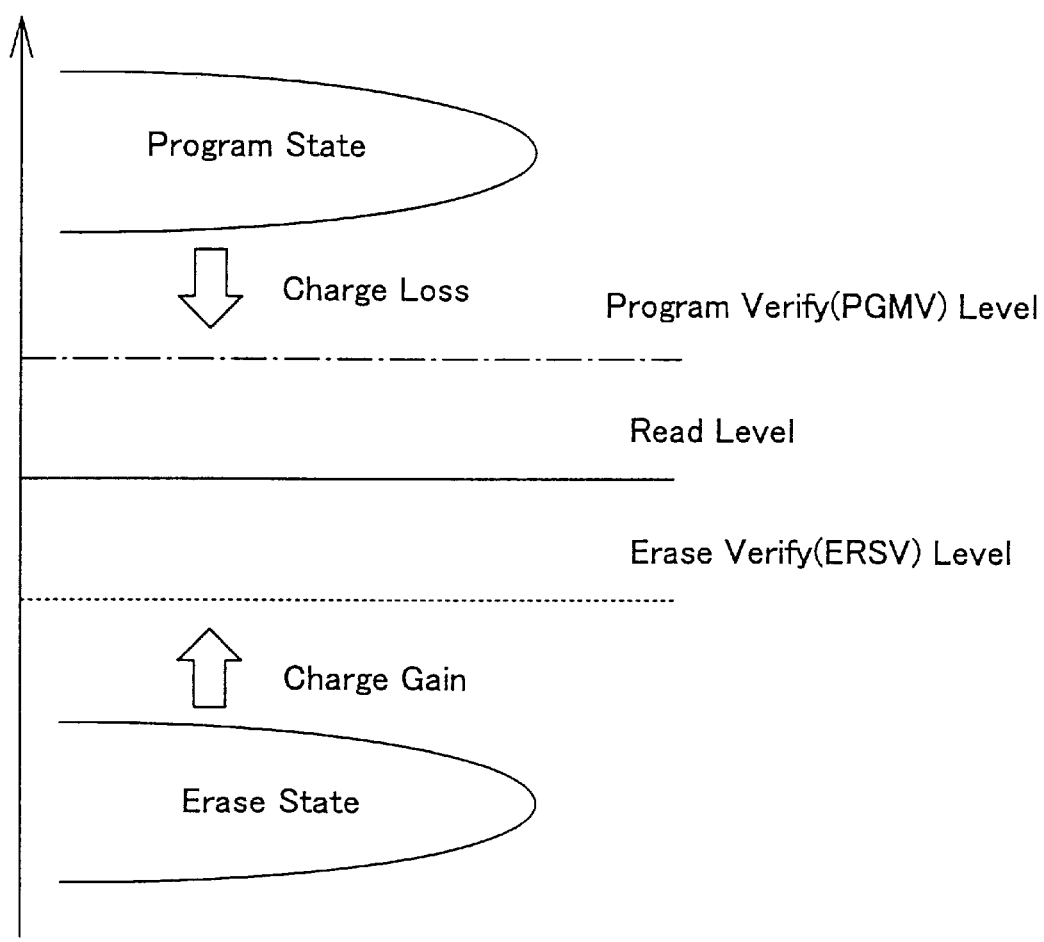
FIG. 2 is an illustrative drawing for explaining the operation of the nonvolatile semiconductor memory device according to the present invention.

FIG. 2 is an illustrative drawing for explaining the operation of the nonvolatile semiconductor memory device according to the present invention.

FIG. 2 shows potentials that are compared by the sense amplifier 26 at the time of read operations and at the time of verify operations. When a program operation is performed, the sense amplifier 26 compares data supplied from a programmed memory cell of the memory cell array 25 with the program-verify-purpose reference potential PGMV Level shown by a dashed line, thereby achieving a verify operation. If the data of the memory cell has a potential higher than the program-verify-purpose reference potential, it is ascertained that this memory cell is securely programmed. If the data of the memory cell exhibits a potential lower than the program-verify-purpose reference potential, another program operation is performed, followed by a further verify operation. This is repeated until sufficient electric charge is accumulated in the memory cell. In this manner, data of programmed memory cells are securely programmed so as to exhibit potentials as shown by "Program State" in FIG. 2.

When an erase operation is performed, the sense amplifier 26 compares data supplied from an erased memory cell of the memory cell array 25 with the erase-verify-purpose reference potential ERSV Level shown by a dotted line, thereby achieving a verify operation. If the data of the memory cell has a potential lower than the erase-verify-purpose reference potential, it is ascertained that this memory cell is securely erased. If the data of the memory cell exhibits a potential higher than the erase-verify-purpose reference potential, another erase operation is performed, followed by a further verify operation. This is repeated until electric charge is sufficiently removed from the memory cell. In this manner, data of erased memory cells are set as to exhibit potentials as shown by "Erase State" in FIG. 2.

During normal and routine read operations, when data of a memory cell is read after this memory cell is programmed or erased as described above, the sense amplifier 26 compares the data read from the memory cell array 25 with the read-purpose reference potential Read Level. If the read data exhibits a potential higher than the reference potential Read Level, the read data is ascertained to be in the programmed state. If the read data exhibits a potential lower than the reference potential Read Level, the read data is ascertained to be in the erased state.

In the present invention, a data-check-purpose read operation can be carried out for the purpose of checking whether data transformation has been taking place. In this data-check-purpose read operation, data is read from the memory cell array 25 first. If it is ascertained that the retrieved data is in the programmed state, the data is further compared with the program-verify-purpose reference potential PGMV level, thereby performing a verify operation. If it is ascertained that the retrieved data is in the erased state, on the other hand, the data is further compared with the erase-verify-purpose reference potential ERSV level, thereby performing a verify operation.

In this manner, the data-check-purpose read operation of the present invention checks a programmed state and an erased state by employing stricter criteria than the reference level Read Level used for a normal and routine read operation.

Namely, if a memory cell in the programmed state suffers charge loss, the potential of retrieved data gradually goes down as illustrated by a downward arrow in FIG. 2, approaching the read-operation reference potential Read Level. If the data potential goes below the read-operation reference potential Read Level, data transformation takes place. In the present invention, the data-check-purpose read operation is performed to compare the retrieved data potential with the program-verify-purpose reference potential PGMV Level, thereby making it possible to detect a sign of ongoing data transformation before the data transformation actually happens.

By the same token, if a memory cell in the erased state suffers charge gain, the potential of retrieved data gradually goes up as illustrated by an upward arrow in FIG. 2, approaching the read-operation reference potential Read Level. If the data potential goes above the read-operation reference potential Read Level, data transformation takes place. In the present invention, the data-check-purpose read operation is performed to compare the retrieved data potential with the erase-verify-purpose reference potential ERSV Level, thereby making it possible to detect a sign of ongoing data transformation before the data transformation actually happens.

With reference to FIG. 1 again, a description will now be given with regard to the data-check-purpose read operation. This operation is controlled by the command control circuit 20.

In the data-check-purpose read operation, a normal and routine read operation is performed first. Then, the date determined by this read operation is supplied from the sense amplifier 26 to the latch 28. The data stored in the latch 28 is then supplied to the reference level generation circuit 27. In response, the reference level generation circuit 27 generates the program-verify-purpose reference potential PGMV Level if the data is that of the programmed state. If the data supplied from the latch 28 is that of the erased state, on the other hand, the reference level generation circuit 27 generates the erase-verify-purpose reference potential ERSV Level. The reference potential generated by the reference level generation circuit 27 is supplied to the sense amplifier 26. The sense amplifier 26 makes another data check to determine the data retrieved form the memory cell array 25 by using the reference potential supplied from the reference level generation circuit 27. The comparator 29 compares the data of the latch 28 determined by the first data check with the data determined by the sense amplifier 26 at the second data check. The result of comparison may be supplied to an exterior of the device from the comparator 29. The result of comparison may be used as an internal control signal for controlling the rewriting or overwriting of data.

The result of comparison obtained by the comparator 29 indicates "pass" if the data determined by the first data check is the same as the data determined by the second data check, indicating that there is no sign of data transformation. If the data determined by the first data check is different from the data determined by the second data check, however, a "fail" result is produced, indicating that there is a sign of ongoing data transformation.

The reference potentials used at the second data check do not have to be the program-verify-purpose reference potential PGMV Level and the erase-verify-purpose reference potential ERSV Level, but can be any potentials as long as they are properly higher and lower, respectively, than the read-operation reference potential Read Level.

Figure 3:
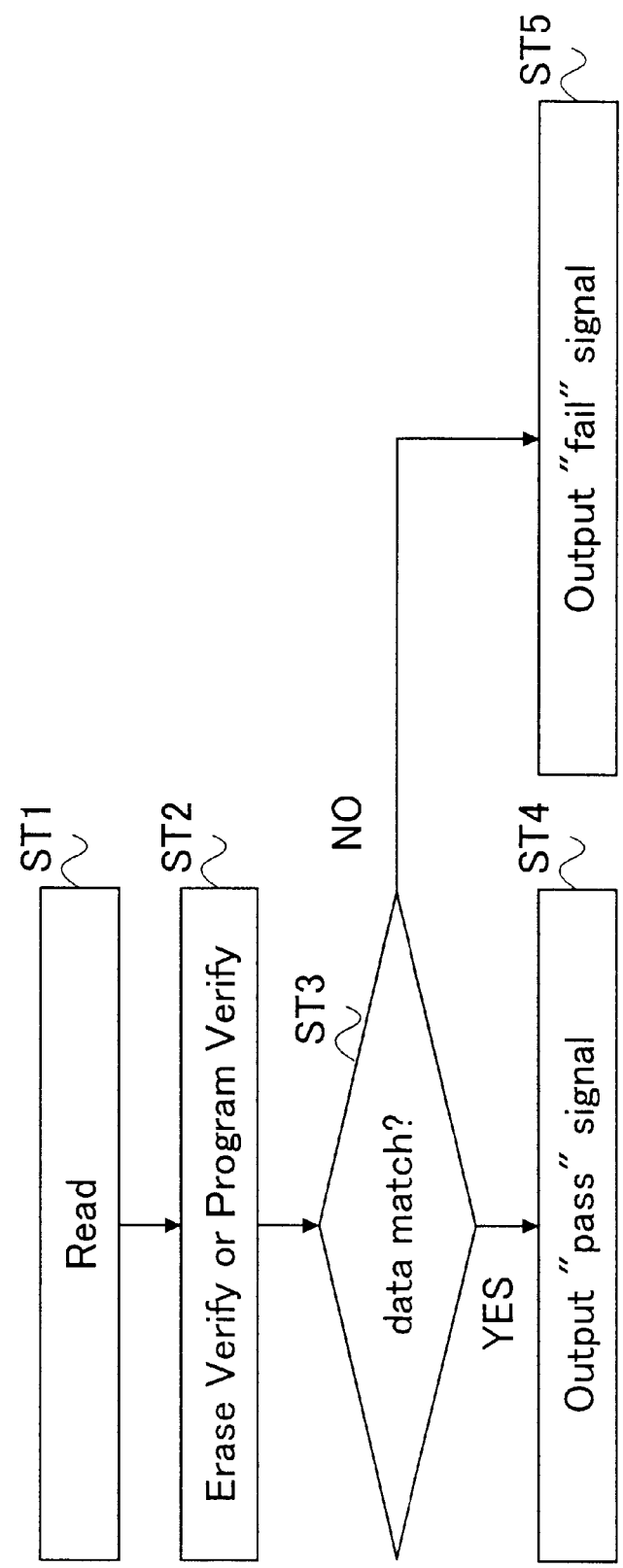
FIG. 3 is a flowchart of a process of outputting the presence/absence of a sign of ongoing data transformation to an exterior of the device.

FIG. 3 is a flowchart of a process of outputting the presence/absence of a sign of ongoing data transformation to an exterior of the device.

At step ST1, a normal and routine read operation is carried out.

At step ST2, a program-verify or erase-verify operation is performed with respect to the retrieved data.

At step ST3, a check is made as to whether the data determined by the read operation is the same as the data determined by the verify operation. If they are the same, the procedure goes to step ST4. Otherwise, the procedure goes to step ST5.

At step ST4, a signal indicative of "pass" is output to the exterior of the device.

At step ST5, a signal indicative of "fail" is output to the exterior of the device.

With this, the procedure comes to an end.

In this manner, the present invention makes a first data determination by performing a normal and routine read operation using the read-operation reference potential, and then makes a second data determination by using the program-verify-purpose reference potential or the erase-verify-purpose reference potential that poses stricter conditions than the read-operation reference potential. If the first data determination and the second data determination are the same, a check result indicative of "pass" is output to an exterior of the device, indicating that there is no apparent sign of data transformation. If the first data determination and the second data determination are different, a check result indicative of "fail" is output to an exterior of the device, indicating that there is a sign of ongoing data transformation. A controller provided outside the device, for example, detects the check result indicative of the presence or absence of data transformation, and carries out a data rewrite operation or a data overwrite operation with respect to the nonvolatile semiconductor memory device as necessary.

Figure 4:
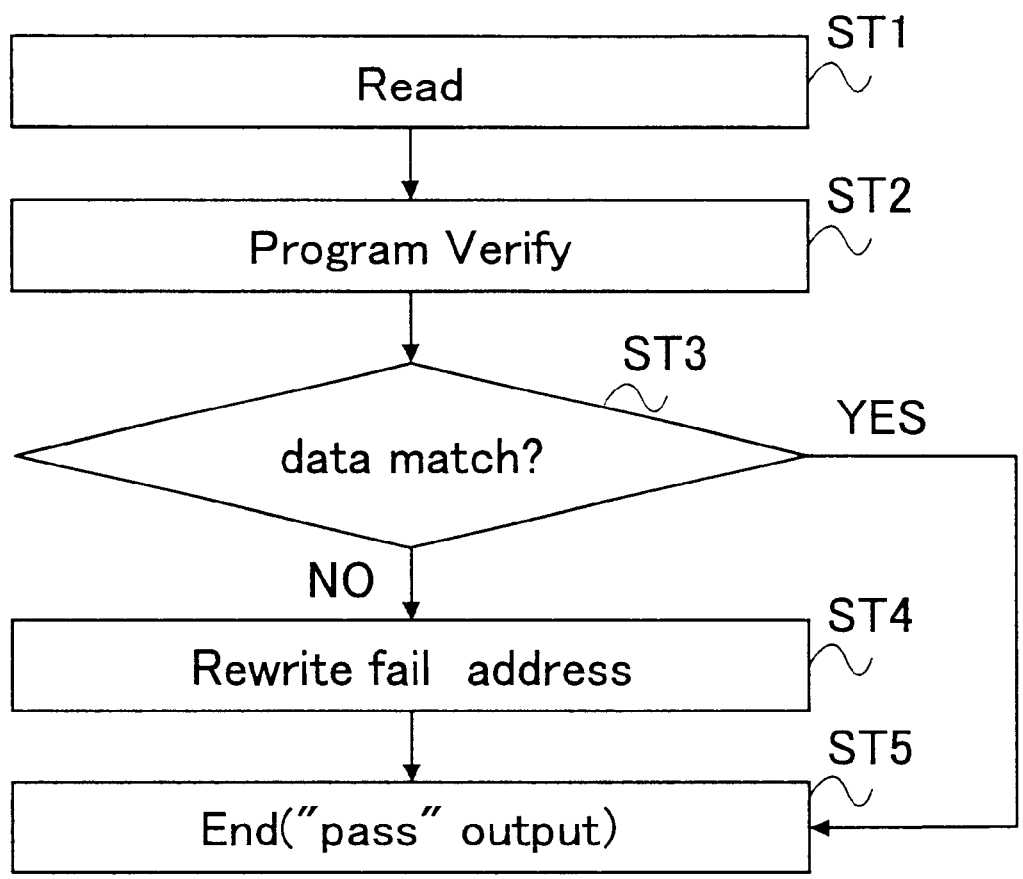
FIG. 4 is a flowchart of a process of performing a data rewrite operation when the check of programmed state data indicates a "fail"

FIG. 4 is a flowchart of a process of performing a data rewrite operation when the check of programmed state data indicates a "fail".

At step ST1, a normal and routine read operation is performed.

At step ST2, a program-verify or erase-verify operation is performed with respect to the retrieved data. This flowchart only shows a process that is performed for a memory cell that is in the programmed state. At step ST2 of FIG. 4, therefore, only a program verify operation is shown for the sake of simplicity.

At step ST3, a check is made as to whether the data determined by the read operation is the same as the data determined by the verify operation. If they are different, the procedure goes to step ST4. Otherwise, the procedure goes to step ST5.

At step ST4, a data rewrite operation for the failed address is performed. That is, a program operation is performed with respect to the failed address.

At step ST5, a signal indicative of "pass" is output to the exterior of the device. With this, the procedure comes to an end.

In this manner, the present invention makes a first data determination by performing a normal and routine read operation using the read-operation reference potential, and then makes a second data determination by using the program-verify-purpose reference potential or the erase-verify-purpose reference potential that poses stricter conditions than the read-operation reference potential. After the program-verify operation, if the first data determination and the second data determination are different, a data rewrite operation for the failed address is performed based on the understanding that data transformation is taking place.

Figure 5:
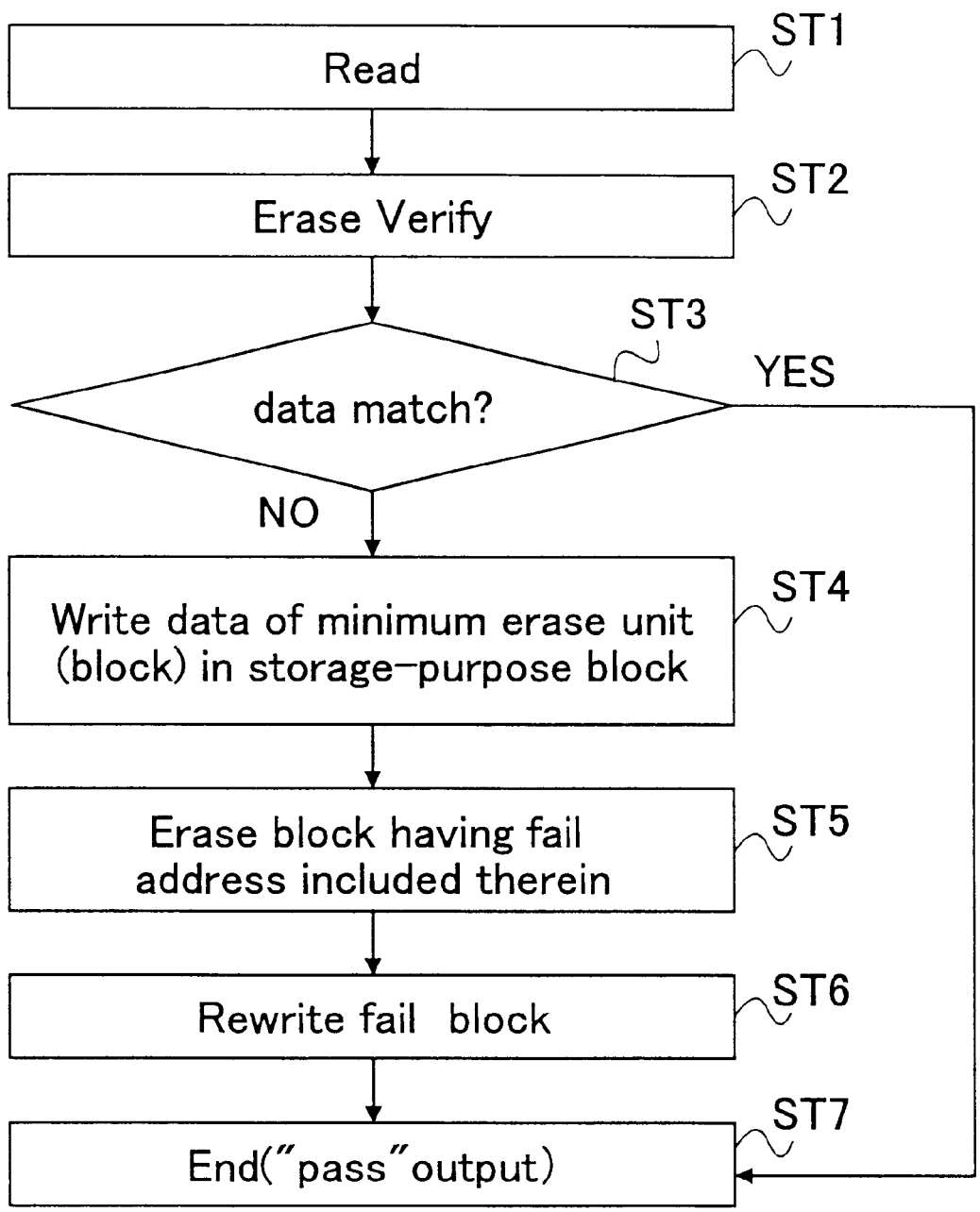
FIG. 5 is a flowchart of a process of performing a data-erase operation and a data-rewrite operation when the check of erased state data indicates a "fail"

FIG. 5 is a flowchart of a process of performing a data-erase operation and a data-rewrite operation when the check of erased state data indicates a "fail".

At step ST1, a normal and routine read operation is performed.

At step ST2, a program-verify or erase-verify operation is performed with respect to the retrieved data. This flowchart only shows a process that is performed for a memory cell that is in the erased state. At step ST2 of FIG. 5, therefore, only an erase verify operation is shown for the sake of simplicity.

At step ST3, a check is made as to whether the data determined by the read operation is the same as the data determined by the verify operation. If they are different, the procedure goes to step ST4. Otherwise, the procedure goes to step ST7.

At step ST4, data of a minimum erasure unit (block) inclusive of the failed address is moved to a block in a data storage area.

At step ST5, the data of the block inclusive of the failed address are erased.

At step ST6, the data of the block in the data storage area are written into the erased block inclusive of the failed address, thereby returning the evacuated data to the original block. This is a data-rewrite operation.

At step ST7, a signal indicative of "pass" is output to the exterior of the device. With this, the procedure comes to an end.

Figure 6:
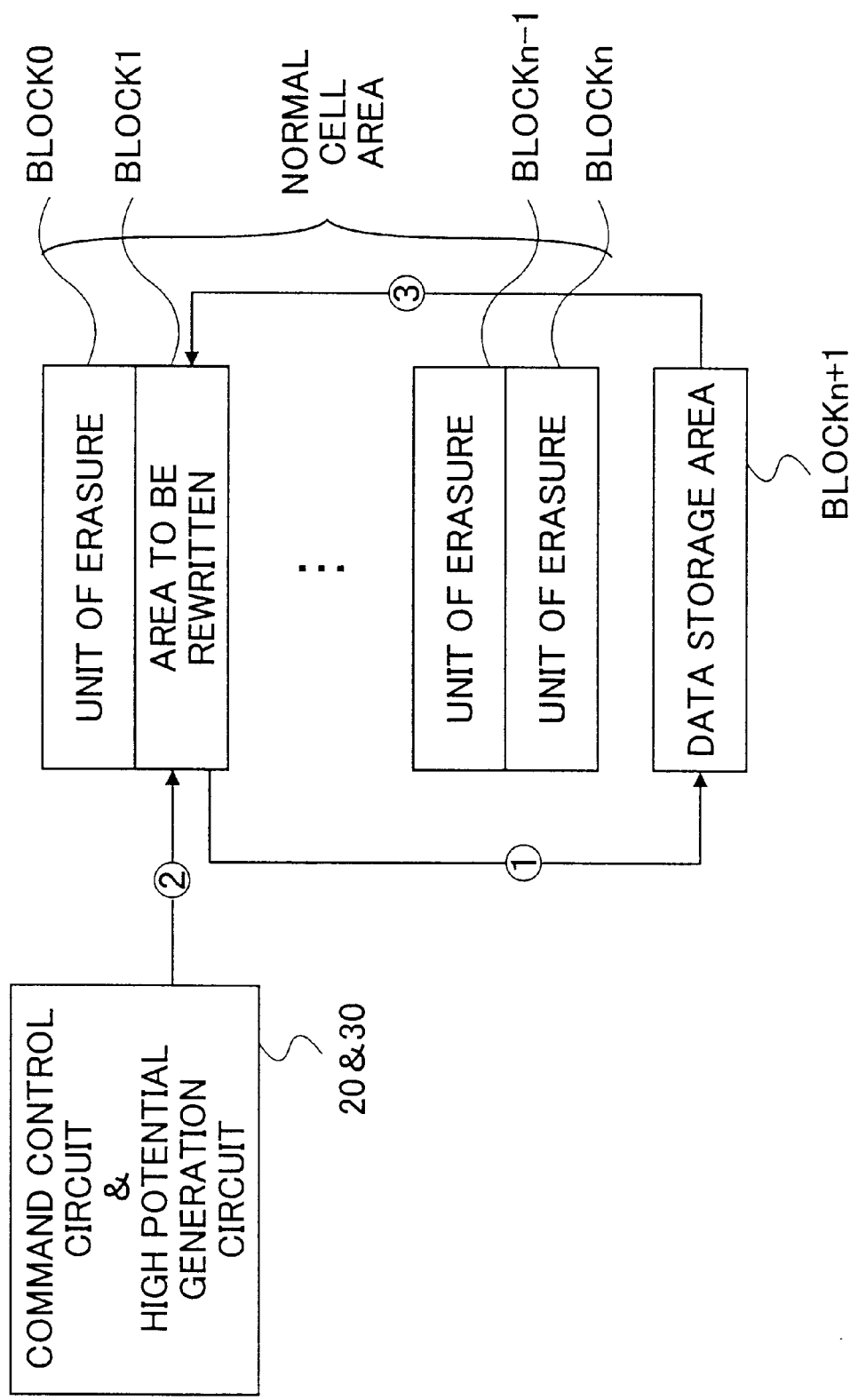
FIG. 6 is an illustrative drawing for explaining the data-erase operation and the data-rewrite operation described in the flowchart of FIG. 5.

FIG. 6 is an illustrative drawing for explaining the data-erase operation and the data-rewrite operation described in the above flowchart.

As shown in FIG. 6, a normal cell area that is a data storage area is divided into a plurality of blocks BLOCK0 through BLOCKn, each of which corresponds in size to a minimum unit of erasure. First, data of the block BLOCK1 that is subjected to data rewriting are moved to the block BLOCKn+1 serving as a data storage area (evacuation area). This operation corresponds to step ST4 of FIG. 5. Then, the high potential generation circuit 30 operating under the control of the command control circuit 20 generates an erase-purpose potential, thereby erasing the data of the block BLOCK1 that is subjected to data rewriting. This operation corresponds to step ST5 of FIG. 5. Finally, the data of the block BLOCKn+1 serving as the data storage area (evacuation area) are moved to the erased block BLOCK1, thereby returning the evacuated data to their original place. This operation corresponds to step ST6 of FIG. 5.

In this manner, the present invention makes a first data determination by performing a normal and routine read operation using the read-operation reference potential, and then makes a second data determination by using the program-verify-purpose reference potential or the erase-verify-purpose reference potential that poses stricter conditions than the read-operation reference potential. After the erase-verify operation, if the first data determination and the second data determination are different, the data-erase and data-rewrite operations are performed for the block inclusive of the failed address based on the understanding that data transformation is taking place.

The data-rewrite operation as described above in connection with FIG. 4 and FIG. 5 may be performed by using a controller or the like outside the device to detect the check result indicative of a "fail" and to instruct the nonvolatile semiconductor memory device to perform a data rewrite operation. Alternatively, provision is made such that the command control circuit 20 performs a predetermined data rewrite operation internally in response to the check result indicative of a "fail".

The data-check-purpose read operation for checking the presence/absence of a sign of data transformation may be controlled by instructions from a controller external to the device. With regard to the timing of the data-check-purpose read operation, provision may be made such that the external controller or the like counts a number as to how may times access operations either a read operation or a write operation are performed with respect to the nonvolatile semiconductor memory device, and such that the data-check-purpose read operation is triggered in response to the counting of a predetermined number of access operations. Alternatively, provision may be made such that the external controller or the like orders the nonvolatile semiconductor memory device to carry out a data-check-purpose read operation at predetermined intervals. Alternatively, the counting of access operations and a time marking function may be combined such that a data-check-purpose read operation is performed within a predetermined time period after a predetermined number of access operations are counted. In this manner, the present invention is not limited to a particular configuration and a mode of operations in terms of the timing at which the data-read-purpose check operation is performed.

The timing of the data-read-purpose check operation may be controlled internally as described in the following rather than controlled externally.

Figure 7:
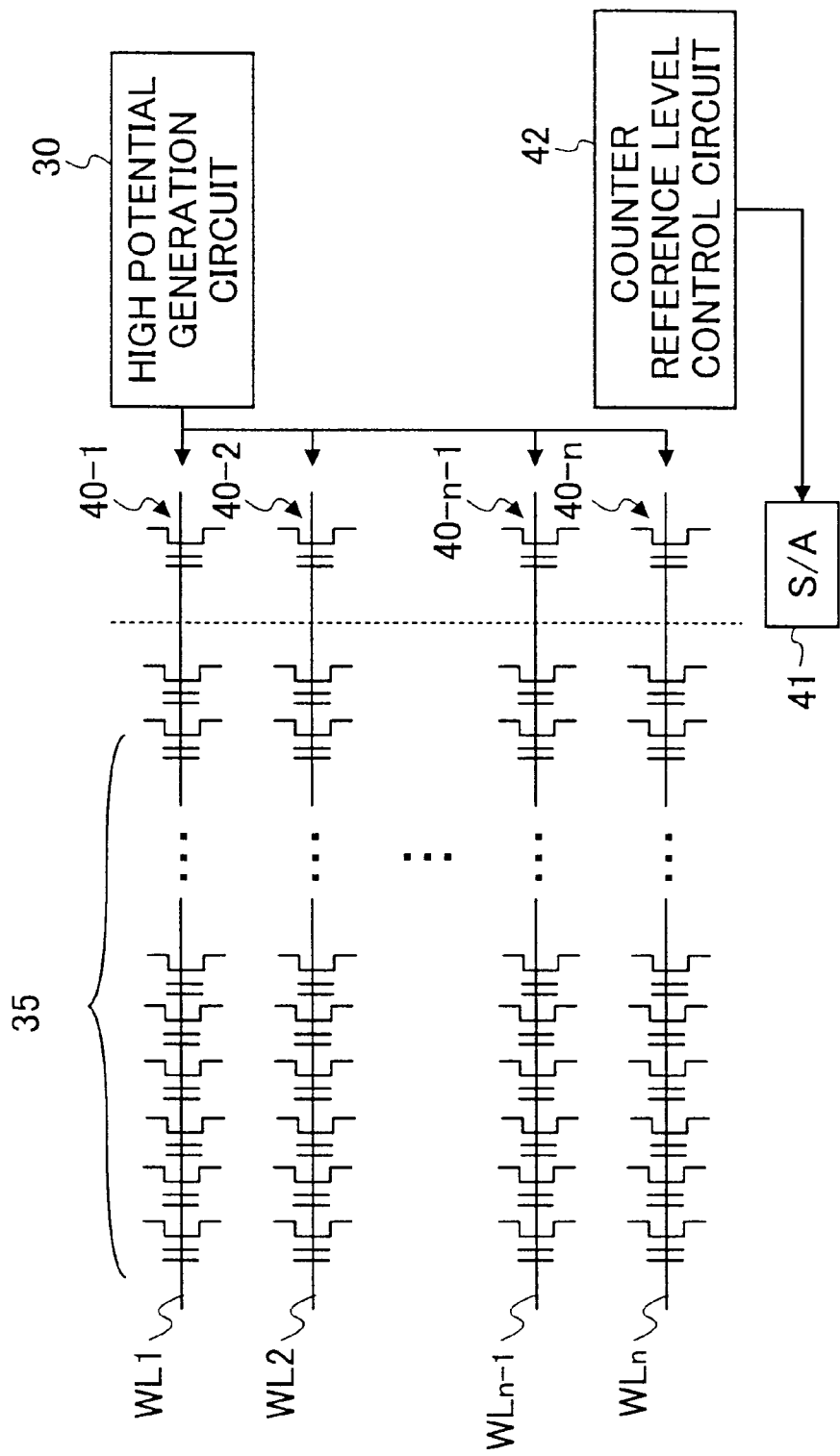
FIG. 7 is a block diagram showing a variation of a configuration that performs a data-check-purpose read operation according to the present invention.

FIG. 7 is a block diagram showing a variation of a configuration that performs a data-check-purpose read operation according to the present invention.

Word lines WL1 through WLn of FIG. 7 are selectively activated by the row decoder 23 (FIG. 1), thereby making a choice of memory cells 35 in the memory cell array 25 with respect to rows thereof. In the example of FIG. 7, counters 40-1 through 40-n are provided for the word lines WL1 through WLn, respectively. The counters 40-1 through 40-n are comprised of memory cell transistors similar to those of the memory cells 35, and have gates thereof connected to the respective word lines WL1 through WLn. Each time a word line is selectively activated, a corresponding one of the counters 40-1 through 40-n accumulates therein a small amount of electric charge. The amount of electric charge accumulated over the time thus reflects how many times the corresponding word line has been activated. Namely, use of the memory cell transistors of the counters 40-1 through 40-n makes it possible to count the number of occurrences of selective activation on a word-line-specific basis.

When an erase potential generated by the high potential generation circuit 30 erases the memory cells 35, the counters 40-1 through 40-n are erased in the same manner and reset.

A sense amplifier 41 compares the level of count data retrieved from a counter connected to a selectively activated word line with a reference potential supplied from a counter-reference-level control circuit 42. If the count data has a potential higher than the reference potential as a result of the comparison by the sense amplifier 41, this is a sign that the selectively activated word line has been activated more than a predetermined number of times. In this manner, the comparison by the sense amplifier 41 can be monitored to detect whether a word line has been activated more than a predetermined number of times.

If it is ascertained that a word line has been activated more times than the predetermined number of times, the command control circuit 20 (FIG. 1) of the nonvolatile semiconductor memory device has a data-check-purpose read operation performed with respect to the memory cells of the relevant word line. For example, the row address of the relevant word line is identified and supplied to the address buffer 22 and the row decoder 23, and, then, a data-check-purpose read operation is performed. This makes it possible to perform the data-check-purpose read operation with respect to the memory cells of the relevant word line.

In this manner, the counters 40-1 through 40-n count the number of occurrences of word-line activation on a word-line-specific basis, and the sense amplifier 41 checks the counted number, followed by the command control circuit 20 attending to control operations based on the obtained count. This achieves a data-check-purpose read operation performed at proper timing.

Further, the present invention is not limited to these embodiments, but various variations and modifications may be made without departing from the scope of the present invention.

The present application is based on Japanese priority application No. 2001-028712 filed on Feb. 5, 2001, with the Japanese Patent Office, the entire contents of which are hereby incorporated by reference.

What is claimed is:

1. A nonvolatile semiconductor memory device, comprising:
   a memory cell array;
   a reference potential generating circuit which generates a first reference potential, a second reference potential higher than the first reference potential, and a third reference potential lower than the first reference potential;
   a sense amplifier which makes a first determination by comparing a potential of data retrieved from said memory cell array with the first reference potential, and makes a second determination by comparing the potential of the data with one of the second reference potential and the third reference potential; and
   a comparison unit which produces a signal indicative of a result of comparison of the first determination with the second determination.

2. The nonvolatile semiconductor memory device as claimed in claim 1, wherein the signal produced by said comparison unit is supplied to an exterior of said nonvolatile semiconductor memory device.

3. The nonvolatile semiconductor memory device, as claimed in claim 1, wherein said sense amplifier makes the second determination by comparing the potential of the data with the second reference potential in response to the first determination that indicates a programmed state, and makes the second determination by comparing the potential of the data with the third reference potential in response to the first determination that indicates an erased state.

4. The nonvolatile semiconductor memory device as claimed in claim 3, further comprising a latch circuit which stores the first determination made by said sense amplifier, wherein said reference potential generating circuit supplies the second reference potential to said sense amplifier in response to a finding that said latch circuit stores therein the first determination indicating the programmed state, and supplies the third reference potential to said sense amplifier in response to a finding that said latch circuit stores therein the first determination indicating the erased state.

5. The nonvolatile semiconductor memory device as claimed in claim 4, wherein said comparison unit compares the first determination stored in said latch circuit with the second determination made by said sense amplifier.

6. The nonvolatile semiconductor memory device as claimed in claim 3, wherein said comparison unit generates a "pass" check result in response to a finding that the first determination is the same as the second determination, and generates a "fail" check result in response to a finding that the first determination is different from the second determination.

7. The nonvolatile semiconductor memory device as claimed in claim 6, wherein the data retrieved from said memory cell array is rewritten in said memory cell array in response to the "fail" check result generated by said comparison unit.

8. The nonvolatile semiconductor memory device as claimed in claim 1, wherein operations by said sense amplifier of making the first determination and the second determination and an operation by said comparison unit of comparing the first determination with the second determination are performed in response to instruction from an exterior of said nonvolatile semiconductor memory device.

9. The nonvolatile semiconductor memory device as claimed in claim 1, further comprising:
   a plurality of word lines selectively activated;
   a plurality counters, each of which is provided for a corresponding one of the word lines, and counts a number as to how many times the corresponding one of the word lines is activated; and
   a check circuit which checks whether any one of said counters indicates the counted number that exceeds a predetermined number.

10. The nonvolatile semiconductor memory device as claimed in claim 9, wherein operations by said sense amplifier of making the first determination and the second determination and an operation by said comparison unit of comparing the first determination with the second determination are performed in response to a finding by said check circuit that one of said counters indicates the counted number that exceeds the predetermined number.

* * * * *